(12) United States Patent
Sumimoto et al.

(10) Patent No.: US 7,634,744 B2
(45) Date of Patent: Dec. 15, 2009

(54) SEMICONDUCTOR MEMORY DEVICE AND METHOD FOR GENERATING ROM DATA PATTERN

(75) Inventors: Yoshihiko Sumimoto, Osaka (JP); Kiyoto Ohta, Osaka (JP)

(73) Assignee: Panasonic Corporation, Osaka (JP)

( * ) Notice: Subject to any disclaimer, the term of this patent is extended or adjusted under 35 U.S.C. 154(b) by 314 days.

(21) Appl. No.: 11/488,196

(22) Filed: Jul. 18, 2006

(65) Prior Publication Data

US 2007/0018256 A1    Jan. 25, 2007

(30) Foreign Application Priority Data

Jul. 21, 2005   (JP)   ............ 2005-211345

(51) Int. Cl.
*G06F 17/50*   (2006.01)
(52) U.S. Cl. ............ 716/2; 716/1; 716/8; 716/10
(58) Field of Classification Search ............ 716/1, 716/2, 8, 10; 257/314–319, 390; 365/63, 365/154, 185.11–185.13, 185.18, 185.29
See application file for complete search history.

(56) References Cited

U.S. PATENT DOCUMENTS

| | | | |
|---|---|---|---|
| 5,973,374 A | 10/1999 | Longcor | |
| 6,570,214 B1 * | 5/2003 | Wu | 257/315 |
| 6,914,813 B2 * | 7/2005 | Chevallier et al. | 365/185.05 |
| 2002/0003270 A1 * | 1/2002 | Makino | 257/390 |
| 2004/0026748 A1 | 2/2004 | Goda et al. | |
| 2004/0071011 A1 * | 4/2004 | Nishizaka et al. | 365/154 |
| 2004/0079984 A1 | 4/2004 | Kao et al. | |

FOREIGN PATENT DOCUMENTS

JP   2004342261   12/2004

* cited by examiner

*Primary Examiner*—Vuthe Siek
(74) *Attorney, Agent, or Firm*—Dickinson Wright PLLC

(57) ABSTRACT

By simplifying the shape of memory cell diffused mask patterns, the patterns are formed stably and the yield of a semiconductor memory device is improved. Adjacent 2-bit memory cell transistors are formed with one diffused mask pattern, the diffused mask patterns are arranged on a memory cell array, and metal lines are used as source common lines for the memory cells formed at the diffused mask patterns. In this way, that is, by using 2-bit rectangular diffused mask patterns as the memory cell diffused mask patterns and using the metal lines as the source common lines instead of diffused layers, the shape of the memory cell diffused mask patterns is simplified. And furthermore, the continuity of the memory cell diffused mask patterns used as actual memory cells is kept, accuracy in forming the actual memory cell diffused mask patterns is improved, and the yield of the semiconductor memory device is improved.

4 Claims, 9 Drawing Sheets

RELATED ART Fig. 8

SEMICONDUCTOR MEMORY DEVICE AND METHOD FOR GENERATING ROM DATA PATTERN

BACKGROUND OF THE INVENTION

1. Field of the Invention

The present invention relates to a semiconductor memory device such as a mask ROM (read only memory) and, more particularly, to a semiconductor memory device fabricated by using a layout technique for realizing the easy formation of memory cell diffused mask patterns and to a method for generating a ROM data pattern.

2. Description of the Related Art

FIG. 7 is a block diagram showing the structure of a mask ROM shown as an example of conventional semiconductor memory devices.

Such a semiconductor memory device comprises a memory cell array 20 where memory cell diffused mask patterns 21's are formed by using comb-shaped N-type MOS transistors, a control unit 3 which controls address signals and chip enabling signals from the outside, a row decoder 2 which selects a word line with a row address signal controlled by the control unit 3, and a column decoder 4 which selects a bit line with a column address signal controlled by the control unit 3.

Word lines 22's are connected to the gates of the memory cell transistors, and bit lines 23's are connected to the drains of the memory cell transistors via drain node contacts 24's. In addition, the sources of the memory cell transistors are connected to one after the other by using the memory cell diffused mask patterns 21's in the row direction in the memory cell array 20 and are grounded at the row decoder 2. The shape of the memory cell diffused mask patterns 21's is shown in FIG. 8.

As shown in FIG. 8, the conventional memory cell diffused mask patterns are formed in the shape of a comb in the row direction and repeatedly disposed in the column direction in the memory cell array 20. Through the adoption of such a structure, the contact-type mask ROM is fabricated in which the 2-bit memory cell transistors are formed by using one diffused mask pattern and the presence or absence of the drain node contact 24 is brought into correspondence with stored data "0" or "1".

And furthermore, FIG. 9 is a schematic diagram made by taking a part from the memory cell array 20 of FIG. 7, which represents the memory cell diffused mask pattern 21 in the shape of the 2-bit comb-shaped diffused mask pattern, the word lines (n) 22a and (n−1) 22b connected to the gates of the memory cell transistors, and the bit lines (m−1) 23a, (m) 23b, and (m+1) 23c connected via the drain node contacts 24's to the drains of the memory cell transistors generated at the memory cell diffused mask pattern 21.

In such a structure, the sources of all the memory cell transistors are connected to one after the other via the diffused layer, i.e., the comb-shaped memory cell diffused pattern and has a ground potential as a source potential. Because of this, for example, when the word line (n) 22a has been selected by the row decoder 2 with a row address signal controlled by the control unit 3, the upper memory cell transistors of the comb-shaped memory cell diffused mask pattern 21 are turned on, the bit line (m) 23b of the memory cell to which the drain node contact 24 is disposed in advance comes to have the ground potential representing the source potential, and data "0" is read out in response to the selection of the bit line (m) 23b made by the column decoder 4 with a column address signal controlled by the control unit 3. On the other hand, the potential of the bit lines (m−1) 23a and (m+1) 23c for the memory cells to which such drain node contacts 24's are not disposed in advance remains at a precharge potential because the memory cell transistors are turned on but the source potential is not conveyed to the bit lines (m−1) 23a and (m+1) 23c due to the nondisposition of the drain node contacts 24's. Therefore, when the bit lines (m−1) 23a and (m+1) 23c have been selected by the column decoder 4 with a column address signal controlled by the control unit 3, data "1" is read out.

As described above, the sources of all the memory cell transistors are connected to one after the other via the diffused layer, i.e., the comb-shaped memory cell diffused patterns and have the ground potential as the source potential, and therefore when the word line (n−1) 22b has been selected by the row decoder 2 with a row address signal controlled by the control unit 3 as well, the lower memory cell transistors of the comb-shaped memory cell diffused mask pattern 21 are turned on. Then the bit lines (m−1) 23a, (m) 23b, and (m+1) 23c for the memory cells to which the drain node contacts 24's are disposed in advance come to have the ground potential representing the source potential. And furthermore, data "0" is read out in response to the selection of the bit line (m−1) 23a, (m) 23b, or (m+1) 23c made by the column decoder 4 with a column address signal controlled by the control unit 3.

As mentioned above, the memory cell diffused mask patterns are formed as the 2-bit comb-shaped patterns where the source nodes are shared in the row direction at the diffused layers (see JP-A No. 2004-342261).

In the conventional semiconductor memory device described above, because of the sharing of the sources of the memory cells, the memory cell diffused mask patterns are formed as the 2-bit comb-shaped diffused mask patterns where the wiring is made at the diffused layer.

However, in semiconductor memory devices having such a structure, the formation of the comb-shaped patterns has become difficult as semiconductor memory devices have become smaller in recent years, which has become the cause of the decreased yield of the semiconductor memory devices such as imbalance in the shape of memory cells and the malformation of memory cells.

SUMMARY OF THE INVENTION

An object of the present invention is to provide a semiconductor memory device whose memory cell diffused mask patterns are stably formed and whose yield is improved by simplifying the shape of the memory cell diffused mask patterns and a method for generating a ROM data pattern.

To accomplish the above object, a semiconductor memory device according to a first aspect of the invention has a structure in which adjacent 2-bit memory cell transistors are formed with one diffused mask pattern, the diffused mask patterns are arranged on a memory cell array, and metal lines are used as source common lines for the memory cells formed at the diffused mask patterns.

That is, by using 2-bit rectangular diffused mask patterns instead of such conventional 2-bit comb-shaped memory cell diffused mask patterns and using metal lines instead of such diffused layers as source common lines for the memory cells, the shape of the memory cell diffused mask patterns are simplified.

Such a structure makes it possible to obtain the effects of simplifying the shape of the memory cell diffused mask patterns and of easily forming the patterns. And furthermore, since the patterns can be formed easily, the effect of improving the yield of the semiconductor memory device according to the invention can be obtained.

A semiconductor memory device according to a second aspect of the invention has a structure in which the sources of adjacent 2-bit memory cell transistors are connected to each other, metal lines are used as the source common lines, and by using one contact mask pattern to be connected to the source common lines, the lines are connected to a power supply line that feeds electric current to secure the source potential of the memory cell transistors.

Such a structure, in which the metal lines are used as the source common lines for the memory cell transistors provided in the row direction and one contact mask pattern is used to connect the source common lines to the power supply line together, makes it possible to obtain the effect of preventing an increase in the layout area of the semiconductor memory device.

A semiconductor memory device according to a third aspect of the invention has a structure in which the sources of adjacent 2-bit memory cell transistors are connected to each other, metal lines are used as source common lines and by using one contact mask pattern to be connected to the source common lines, the lines are connected to an internal driving signal line that feeds electric current in such a way that the sources of the memory cell transistors have any potential.

Such a structure, in which the metal lines are used as the source common lines for the memory cell transistors provided in the row direction and one contact mask pattern is used to connect the source common lines to the internal driving signal line that controls the source potential together, makes it possible to obtain the effect of preventing an increase in the layout area of the semiconductor memory device.

A semiconductor memory device according to a fourth aspect of the invention corresponds with that according to the first aspect except that the outermost diffused mask patterns on the memory cell array are not formed as actual memory cells but formed as dummy patterns.

By adopting such a structure in which the outermost 2-bit diffused mask patterns of the memory cell diffused mask patterns included in the memory cell array are not used as the actual memory cells of the ROM but used as the dummy patterns, the continuity of the memory cell diffused mask patterns used as the actual memory cells is kept. The keeping of the pattern continuity makes it possible to obtain the effect of improving accuracy in forming the diffused mask patterns for the actual memory cells.

A semiconductor memory device according to a fifth aspect of the invention corresponds with that according to the first aspect except that a second metal wiring layer or an even upper wiring layer is used as the read data lines for the memory cells and a first metal wiring layer, which is the lowest layer, is used as the power supply line that feeds electric current to secure the source potential of the memory cell transistors.

A semiconductor memory device according to a sixth aspect of the invention corresponds with that according to the second aspect except that a second metal wiring layer or an even upper wiring layer is used as the read data lines for the memory cells and a first metal wiring layer, which is the lowest layer, is used as the power supply line.

According to the fifth and sixth aspects of the invention, by using the first metal wiring layer (the lowest layer of the metal wiring layers) as the power supply line that feeds electric current to secure the source potential of the memory cell transistors, it becomes possible to supply a ground power source to the sources of the memory cell transistors at a low resistance. As a result, a stable source potential is secured, which allows the memory cell transistors to operate stably.

A semiconductor memory device according to a seventh aspect of the invention corresponds with that according to the first aspect except that a second metal wiring layer or an even upper wiring layer is used as the read data lines for the memory cells and a first metal wiring layer, which is the lowest layer, is used as an internal driving signal line that feeds electric current in such a way that the sources of the memory cell transistors have any potential.

A semiconductor memory device according to an eighth aspect of the invention corresponds with that according to the third aspect except that a second metal wiring layer or an even upper wiring layer is used as the read data lines for the memory cells and a first metal wiring layer, which is the lowest layer, is used as an internal driving signal line.

According to the seventh and eighth aspects of the invention, by using the first metal wiring layer (the lowest layer of the metal wiring layers) as the internal driving signal line that feeds electric current in such a way that the sources of the memory cell transistors have any potential, it becomes possible to feed electric current at a low resistance in such a way that the sources of the memory cell transistors have any potential. As a consequence, a stable source potential is secured, which allows the memory cell transistors to operate stably.

A semiconductor memory device according to a ninth aspect of the invention corresponds with that according to the first aspect except that power supply lines, which are source potential strapping lines for use in reducing wiring resistance to secure a stable source potential, are each disposed to units of plural read data lines and that at the power supply line regions as well, the diffused mask patterns are disposed on the array.

A semiconductor memory device according to a tenth aspect of the invention corresponds with that according to the second aspect except that power supply lines, which are source potential strapping lines for use in reducing wiring resistance to secure a stable source potential, are each disposed to units of plural read data lines and that at the power supply line regions as well, the diffused mask patterns are disposed on the array.

A semiconductor memory device according to an eleventh aspect of the invention corresponds with that according to the third aspect except that power supply lines, which are source potential strapping lines for use in reducing wiring resistance to secure a stable source potential, are each disposed to units of plural read data lines and that at the power supply line regions as well, the diffused mask patterns are disposed on the array.

In the semiconductor memory devices according to the ninth, tenth, and eleventh aspects of the invention, the effects of keeping the continuity of the memory cell diffused mask patterns and improving accuracy in forming the diffused mask patterns can be obtained by also forming the memory cell diffused mask patterns at the lower layer in the source potential strapping line regions for use in reducing the wiring resistance to maintain the sources of memory cell transistors at the stable potential.

A semiconductor memory device according to a twelfth aspect of the invention corresponds with that according to the ninth aspect except that the sources and drains of the same memory cell transistors as those generated at the power supply line regions are not provided with contact patterns used for connection to the wiring layer.

In such a structure, the sources and the drains of the transistors formed under the source potential strapping line regions of the semiconductor memory device according to the ninth aspect are not provided with the contact patterns and, therefore, do not have connections with the source potential strapping lines, which makes it possible to obtain the effect of reducing extra word line capacitance.

A semiconductor memory device according to a thirteenth aspect of the invention corresponds with that according to the tenth aspect except that the sources and drains of the same memory cell transistors as those generated at the power supply line regions are not provided with contact patterns used for connection to the wiring layer.

In such a structure, the sources and the drains of the transistors formed under the source potential strapping line regions of the semiconductor memory device according to the tenth aspect are not provided with the contact patterns and, therefore, do not have connections with the source potential strapping lines, which makes it possible to obtain the effect of reducing extra word line capacitance.

A semiconductor memory device according to a fourteenth aspect of the invention corresponds with that according to the eleventh aspect except that the sources and drains of the same memory cell transistors as those generated at the power supply line regions are not provided with contact patterns used for connection to the wiring layer.

In such a structure, the sources and the drains of the transistors formed under the source potential strapping line regions of the semiconductor memory device according to the eleventh aspect are not provided with the contact patterns and, therefore, do not have connections with the source potential strapping lines, which makes it possible to obtain the effect of reducing extra word line capacitance.

A semiconductor memory device according to a fifteenth aspect of the invention corresponds with that according to the first aspect except that a distinction between ROM data 1 and ROM data 0 is made according to the presence or absence of the drain contact patterns of the memory cell transistors.

Such a structure, in which the distinction between ROM data "1" and ROM data "0" is made according to the presence or absence of the drain contact patterns of the memory cell transistors, makes it possible to obtain the effect of easily generating a ROM data pattern in the semiconductor memory device according to the first aspect of the invention.

A semiconductor memory device according to a sixteenth aspect of the invention corresponds with that according to the second aspect except that a distinction between ROM data 1 and ROM data 0 is made according to the presence or absence of the drain contact patterns of the memory cell transistors.

Such a structure, in which the distinction between ROM data "1" and ROM data "0" is made according to the presence or absence of the drain contact patterns of the memory cell transistors, makes it possible to obtain the effect of easily generating a ROM data pattern in the semiconductor memory device according to the second aspect of the invention.

A semiconductor memory device according to a seventeenth aspect of the invention corresponds with that according to the third aspect except that a distinction between ROM data 1 and ROM data 0 is made according to the presence or absence of the drain contact patterns of the memory cell transistors.

Such a structure, in which the distinction between ROM data "1" and ROM data "0" is made according to the presence or absence of the drain contact patterns of the memory cell transistors, makes it possible to obtain the effect of easily generating a ROM data pattern in the semiconductor memory device according to the third aspect of the invention.

A semiconductor memory device according to an eighteenth aspect of the invention has a structure in which in cases where the adjacent 2-bit memory cell transistors of the semiconductor memory device according to the fifteenth aspect are not provided with both the drain contacts, the common source contact patterns are not provided.

A semiconductor memory device according to a nineteenth aspect of the invention has a structure in which in cases where the adjacent 2-bit memory cell transistors of the semiconductor memory device according to the sixteenth aspect are not provided with both the drain contacts, the common source contact patterns are not provided.

A semiconductor memory device according to a twentieth aspect of the invention has a structure in which in cases where the adjacent 2-bit memory cell transistors of the semiconductor memory device according to the seventeenth aspect are not provided with both the drain contacts, the common source contact patterns are not provided.

A method for generating a ROM data pattern according to a twenty-first aspect of the invention is a method for generating the source contact pattern as a ROM data pattern through an operation performed at the time of the generation of the drain contact pattern for ROM data in the semiconductor memory device according to the eighteenth aspect of the invention.

A method for generating a ROM data pattern according to a twenty-second aspect of the invention is a method for generating the source contact pattern as a ROM data pattern through an operation performed at the time of the generation of the drain contact pattern for ROM data in the semiconductor memory device according to the nineteenth aspect of the invention.

A method for generating a ROM data pattern according to a twenty-third aspect of the invention is a method for generating the source contact pattern as a ROM data pattern through an operation performed at the time of the generation of the drain contact pattern for ROM data in the semiconductor memory device according to the twentieth aspect of the invention.

According to the eighteenth and twenty-first aspect of the invention, since the common source node contact patterns are not disposed in the semiconductor memory device according to the fifteenth aspect in cases where the adjacent 2-bit memory cell transistors are not provided with both the drain node contacts, the number of the source node contacts is reduced. Because of this, it is possible to prevent all the contacts from being disposed densely and to easily form the contact patterns, which makes it possible to obtain the effect of improving the yield of the semiconductor memory device.

According to the nineteenth and twenty-second aspect of the invention, since the common source node contact patterns are not disposed in the semiconductor memory device according to the sixteenth aspect in cases where the adjacent 2-bit memory cell transistors are not provided with both the drain node contacts, the number of the source node contacts is reduced. Because of this, it is possible to prevent all the contacts from being disposed densely and to easily form the contact patterns, which makes it possible to obtain the effect of improving the yield of the semiconductor memory device.

According to the twentieth and twenty-third aspect of the invention, since the common source node contact patterns are not disposed in the semiconductor memory device according to the seventeenth aspect in cases where the adjacent 2-bit memory cell transistors are not provided with both the drain node contacts, the number of the source node contacts is reduced. Because of this, it is possible to prevent all the contacts from being disposed densely and to easily form the contact patterns, which makes it possible to obtain the effect of improving the yield of the semiconductor memory device.

DESCRIPTION OF THE PREFERRED EMBODIMENTS

Embodiments according to the present invention will be described below with reference to the drawings.

Figure 1:
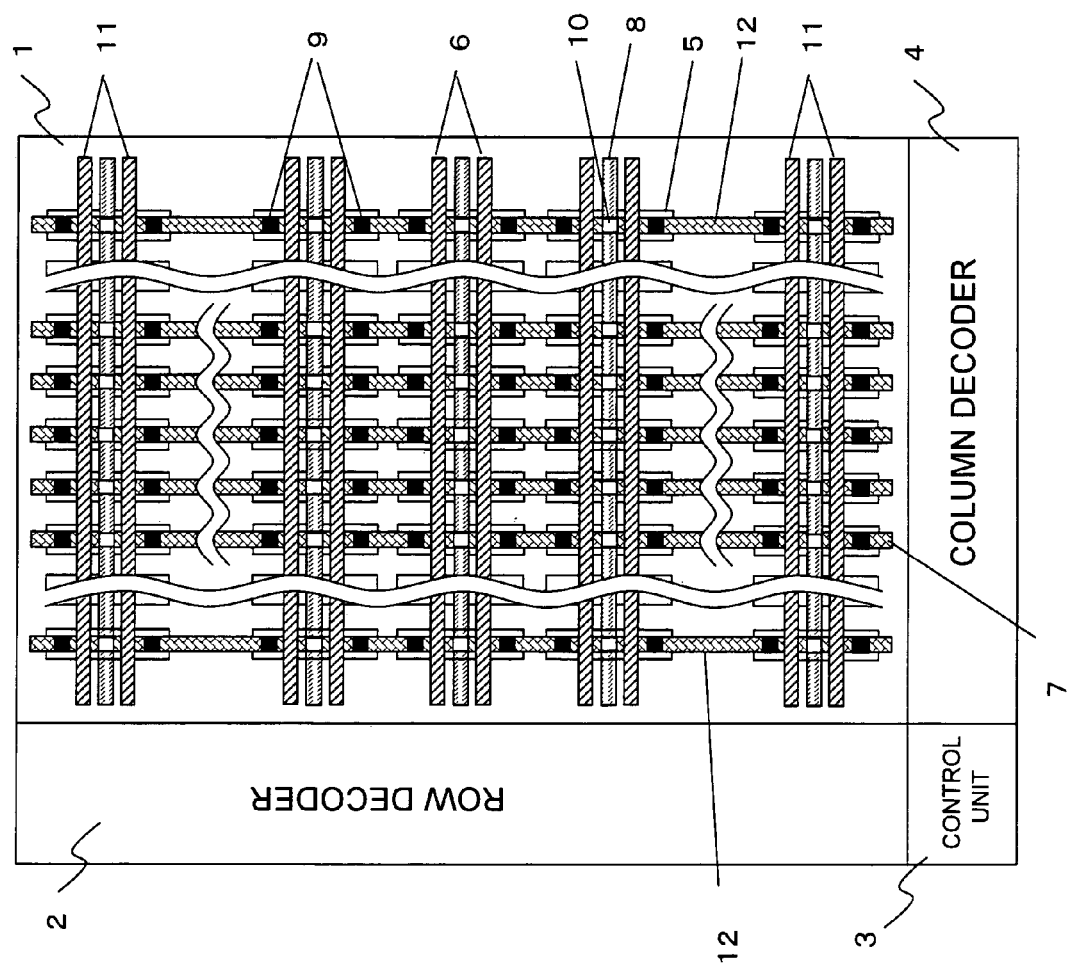
FIG. 1 is a layout drawing showing the structure of a semiconductor memory device according to a first embodiment of the present invention.
Figure 2:
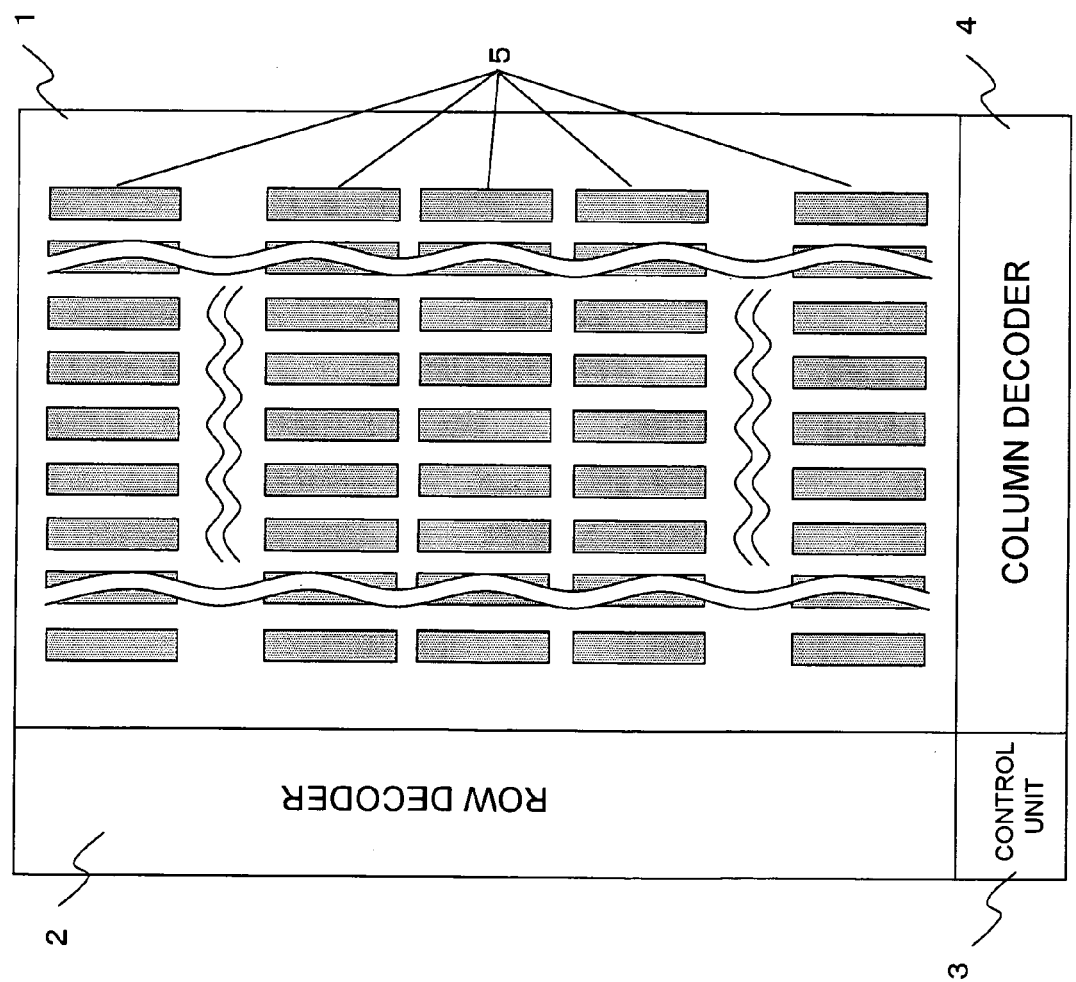
FIG. 2 is a layout drawing showing the shape of the memory cell diffused mask patterns of a memory cell array of FIG. 1.

A first embodiment according to the present invention will be described with reference to FIGS. 1 to 3. FIG. 1 is a layout drawing showing the structure of a semiconductor memory device according to the first embodiment of the invention. FIG. 2 is a layout drawing showing the shape of memory cell diffused mask patterns of a memory cell array shown in FIG. 1.

As shown in FIG. 1, the semiconductor memory device according to the first embodiment of the invention comprises a memory cell array 1 in which memory cell diffused mask patterns 5's are formed in a rectangular shape, a control unit 3 which controls address signals and chip enable signals from the outside, a row decoder 2 which selects word lines with row address signals controlled by the control unit 3, and a column decoder 4 which selects bit lines with column address signals controlled by the control unit 3. The word lines 6's are connected to the gates of memory cell transistors and the bit lines 7's are connected to the drains of the memory cell transistors via drain node contacts 9's. And further, the sources of the memory cell transistors arranged in the same rows are connected to individual source lines 8's in the memory cell array 1 and are grounded at the row decoder 2. A figure that shows the shape of the memory cell diffused mask patterns 5's is represented as FIG. 2.

As shown in FIG. 2, the memory cell diffused mask patterns have a rectangular shape and are repeatedly arranged in both row and column directions in the memory cell array 1. In such a structure, the structure of a contact-type mask ROM is taken in which the 2-bit memory cell transistors are formed by using one diffused mask pattern and the presence or absence of the drain node contacts 9's corresponds to stored data "0" or "1".

Figure 3:
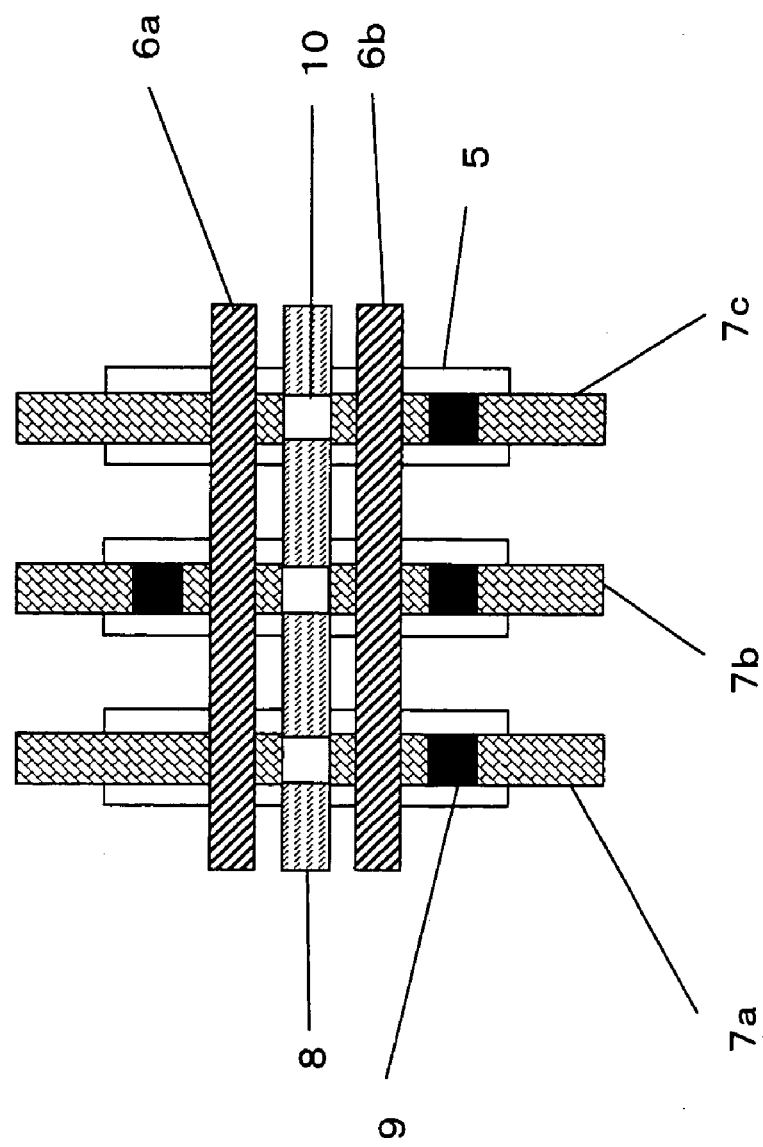
FIG. 3 is a layout drawing of part of the memory cell array of FIG. 1.

Furthermore, FIG. 3 is a layout drawing created by taking a part from the memory cell array 1 of FIG. 1, the part including the memory cell diffused mask patterns 5's in the shape of a 2-bit rectangular diffused mask pattern, the source line 8 connected to the sources of the memory cell transistors generated at the memory cell diffused mask patterns 5's via source node contacts 10's, the word lines (n) 6a and (n−1) 6b connected to the gates of the memory cell transistors, and the bit lines (m−1) 7a, (m) 7b, and (m+1) 7c connected to the drains of the memory cell transistors generated at the memory cell diffused mask patterns 5's via the drain node contacts 9's.

In such a structure, the three sets of adjacent 2-bit memory cell transistors are formed at the three rectangular memory cell diffused mask patterns 5's and the potential of the sources of all the memory cell transistors is set at the ground potential by the source line 8 grounded at the row decoder and the source node contacts 10's. Because of this, for example, when the word line (n) 6a has been selected by the row decoder 2 with a row address signal controlled by the control unit 3, the upper memory cell transistors of the three rectangular memory cell diffused mask patterns 5's are turned on by selecting the word line (n) 6a. Then the bit line (m) 7b for the memory cell where the drain node contact 9 is disposed in advance comes to have the ground potential representing a source potential, and data "0" is read out in response to the selection of the bit line (m) 7b made by the column decoder 4 with a column address signal controlled by the control unit 3. On the other hand, the electric potential of the bit lines (m−1) 7a and (m+1) 7c for the memory cells where no drain node contact 9 is disposed in advance remains at a precharge potential without receiving the source potential because the memory cell transistors are turned on but no drain node contact 9 is disposed. Therefore, when the bit lines (m−1) 7a and (m+1) 7c have been selected by the column decoder 4 with a column address signal controlled by the control unit 3, data "1" is read out.

As described earlier, the potential of the sources of all the memory cell transistors is set at the ground potential by the source line 8 grounded at the row decoder and the source node contacts 10's and, therefore, when the word line (n−1) 6b has been selected by the row decoder 2 with a row address signal controlled by the control unit 3 as well, the lower memory cell transistors of the three rectangular memory cell diffused mask patterns 5's are turned on by selecting the word line (n−1) 6b. Then the bit lines (m−1) 7a, (m) 7b, and (m+1) 7c for the memory cells where the drain node contacts 9's are disposed in advance come to have the ground potential representing the source potential, and data "0" is read out in response to the selection of the bit line (m−1) 7a, (m) 7b or (m+1) 7c made by the column decoder 4 with a column address signal controlled by the control unit 3.

As described above, in terms of operation, the same operation as that of the conventional semiconductor memory device can be implemented.

As for a comparison of the shape of the memory cell diffused mask patterns according to the invention and that of the conventional art, the shape of the 2-bit rectangular diffused patterns according to this embodiment is simplified as compared with that of the conventional 2-bit comb-shaped diffused mask patterns. On account of this, imbalance in the pattern shape and malformation of the patterns hardly occur during the generation of the memory cell diffused mask patterns, and therefore the yield of the semiconductor memory device can be improved.

And further, in FIG. 1, by not using the memory cell transistors formed at the outermost 2-bit rectangular mask patterns of the memory cell array 1 as the actual memory cells of the ROM but providing dummy cells in such a way that the sources are connected to grounded dummy word lines 11's, the drains are connected to grounded dummy bit lines 12's, or the sources and the drains are connected to dummy word lines 11's and dummy bit lines 12's respectively, the outermost 2-bit rectangular diffused mask patterns are provided as dummy patterns. As a result of this, it is possible to keep the continuity of the memory cell diffused mask patterns used as the actual memory cells and to improve accuracy in forming the actual memory cell diffused mask patterns.

Still further, in FIG. 3, by using a metal line as the source common line for the memory cell transistors provided in the row direction and using one contact mask pattern at the sources of the adjacent 2-bit memory cell transistors, the source common lines can be connected to a power supply line together, thereby the effect of preventing an increase in its layout area can be obtained.

Moreover, in FIG. 3, it becomes possible to supply a ground power source to the sources of the memory cell transistors at a low resistance by forming the power supply line for the source line 8 connected to the sources of the memory cell transistors with a first metal wiring layer that is the lowest layer of the metal wiring layers. As a result, a stable source potential can be secured, which allows the memory cell transistors to operate stably. In this case, the bit lines (m−1) 7a, (m) 7b, and (m+1) 7c, which are read data lines, are formed with a second metal wiring layer or an even upper wiring layer.

In addition, in this embodiment of the invention, the source potential of the memory cell transistors has been described as the ground potential, but this is not the one and only way. That is, even when the sources have been connected to an internal driving signal line in order to set the source potential to any potential, the same structure and effect as those described above can be obtained.

A second embodiment according to the invention will be described with reference to FIGS. 4 and 5.

Figure 4:
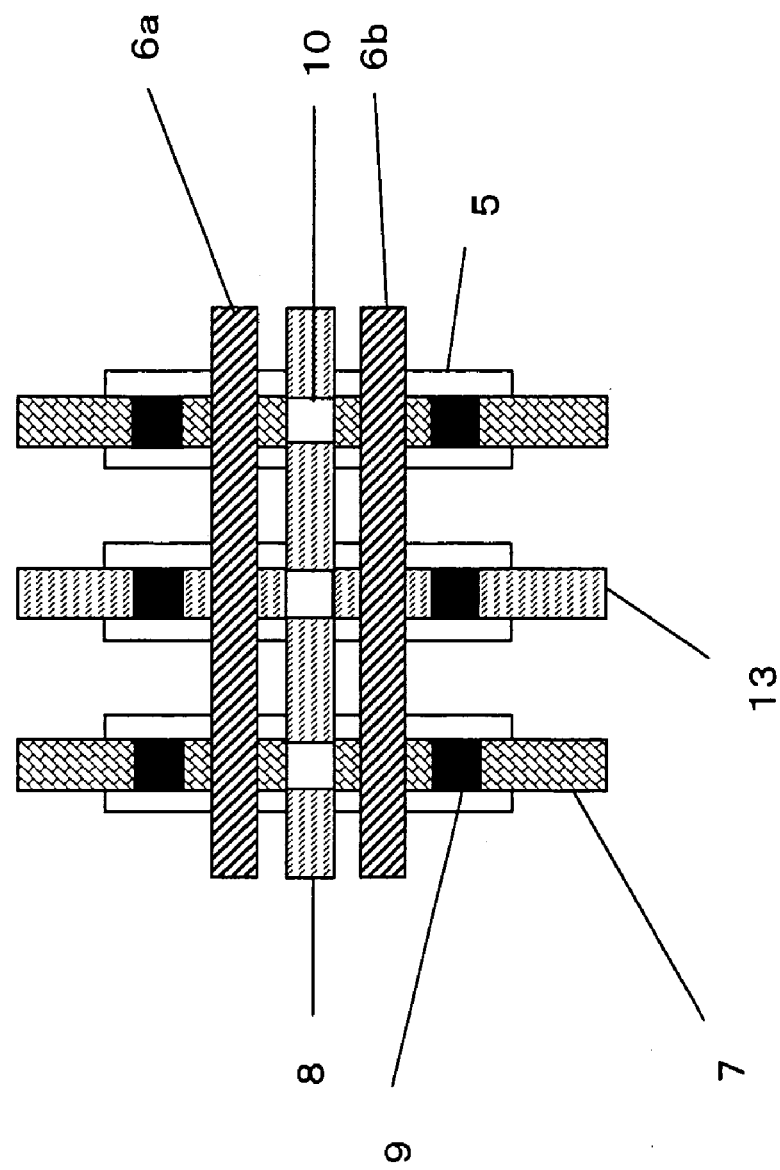
FIG. 4 is a layout drawing of part of a memory cell array included in a semiconductor memory device according to a second embodiment of the invention.

A semiconductor memory device according to the second embodiment of the invention corresponds with the semiconductor memory device according to the first embodiment of the invention with the exception that a structure shown in FIG. 4 is provided in which the memory cell diffused mask patterns 5's having the shape of the 2-bit rectangular diffused mask pattern, the source lines 8's connected to the sources of the memory cell transistors generated at the memory cell diffused mask patterns 5's via the source node contacts 10's, the word lines (n) 6a and (n−1) 6b connected to the gates of the memory cell transistors, the bit lines 7's connected to the drains of the memory cell transistors generated at the memory cell diffused mask patterns 5's via the drain node contacts 9's, and source potential strapping lines 13's each disposed between the bit lines 7's that are the read data lines are arranged. The source potential strapping lines 13's are each disposed to units composed of the plural read data lines. By forming such a structure, a memory capacity is increased, an increase in wiring resistance, which results from the increased wiring lengths of the source lines 8's provided in the row direction, can be prevented, and a fluctuation in the source potential can be reduced to stably secured the source potential.

As shown in FIG. 4, in the source potential strapping wiring region as well, the structure, in which the memory cell diffused mask patterns 5's are disposed onto the lower layer to generate the memory cell transistors thereon, is formed and through the disposition of the source node contacts 10's and the drain node contacts 9's, both sources and drains come to have the same potential as that of the source potential strapping line 13, which makes it possible to treat the outermost memory cells as dummy cells. As a result of this, in the source potential strapping wiring regions as well, it is possible to keep the continuity of the memory cell diffused mask patterns 5's and to obtain the effect of improving accuracy in forming the diffused mask patterns.

Figure 5:
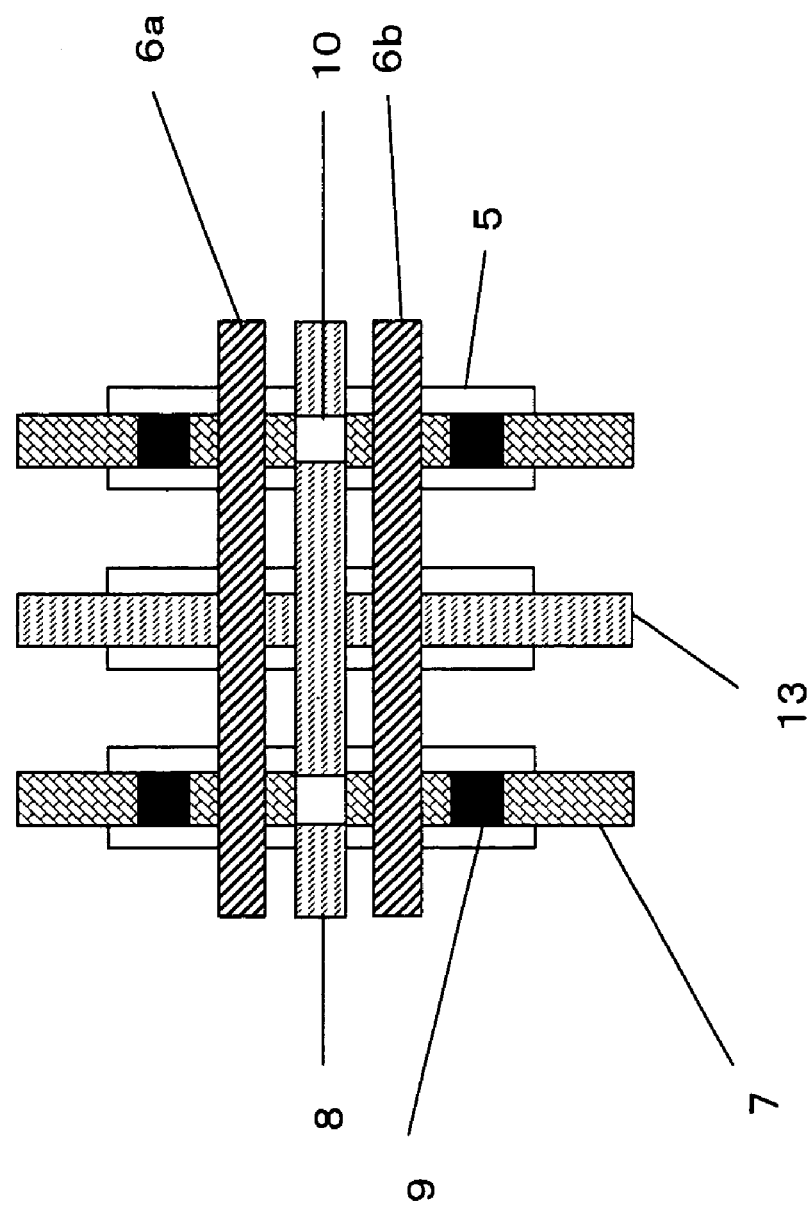
FIG. 5 is a layout drawing showing a case where drain node contacts are not disposed onto adjacent 2-bit memory cell transistors included in the structure of FIG. 4.

Furthermore, in FIG. 5, a structure, in which the source potential strapping line 13 is disposed between the bit lines 7's that are the read data lines and the memory cell diffused mask patterns 5's are also disposed onto the lower layer in the source potential strapping line region, is shown in order to increase a memory capacity, prevent an increase in wiring resistance resulting from the increased wiring lengths of the source lines 8's provided in the row direction, and reduce a fluctuation in the source potential to stably secure the source potential as in the case of the structure shown in FIG. 4. Because of this, in the source potential strapping line region as well, it is possible to obtain the effects of keeping the continuity of the memory cell diffused mask patterns 5's and improving accuracy in forming the diffused mask pattern. In addition to this, in the layout shown in FIG. 5, the sources and drains of the memory cell transistors generated are not provided with contact patterns for the source potential strapping line and, therefore, not connected to the strapping line, thereby the effect of reducing extra word line capacitance can be obtained.

A third embodiment according to the invention will be described with reference to FIG. 6.

As shown in the layout drawing 6 made by taking a part from its memory cell array 1, a semiconductor memory device according to the third embodiment of the invention corresponds with the semiconductor memory device according to the first embodiment of the invention except a structure where the memory cell diffused mask patterns 5's having the shape of the 2-bit rectangular diffused mask pattern, the source lines 8's connected to the sources of the memory cell transistors generated at the memory cell diffused mask patterns 5's via the source node contacts 10's, the word lines (n) 6a and (n−1) 6b connected to the gates of the memory cell transistors, and bit lines (s−1) 7d, (s) 7e, and (s+1) 7f connected to the drains of the memory cell transistors generated at the memory cell diffused mask patterns 5's via the drain node contacts 9's are provided. The semiconductor memory device according to the third embodiment has the structure of a contact-type mask ROM in which a distinction as to ROM data "0" and "1" is made to correspond to a distinction as to stored data "0" and "1" according to the presence or absence of the drain node contact 9. Because of this, when ROM data is set at "0" in either or both of the adjacent 2-bit memory cell transistors, there is a need to dispose the source node contacts 10's in order to connect the sources of the memory cell transistors to the source lines 8's grounded at the row decoder and to dispose the drain node contacts 9's in order to read data "0" to the bit lines. However, when ROM data is set at "1" in both the adjacent 2-bit memory cell transistors, the potential of the bit lines remains at a precharge potential because there is no need to read the source potential thereto, whereby there is no need to dispose not only the drain node contacts 9's but the source node contacts 10's.

Figure 6:
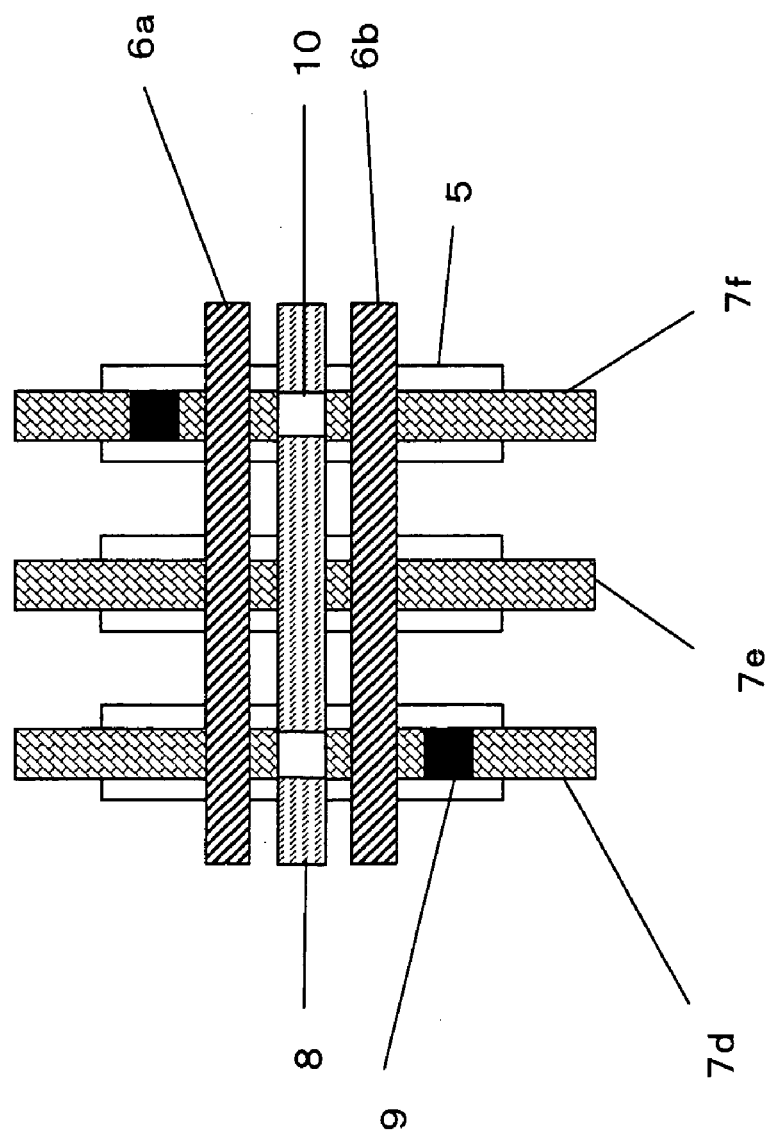
FIG. 6 is a layout drawing of part of a memory cell array included in a semiconductor memory device according to a third embodiment of the invention.
Figure 7:
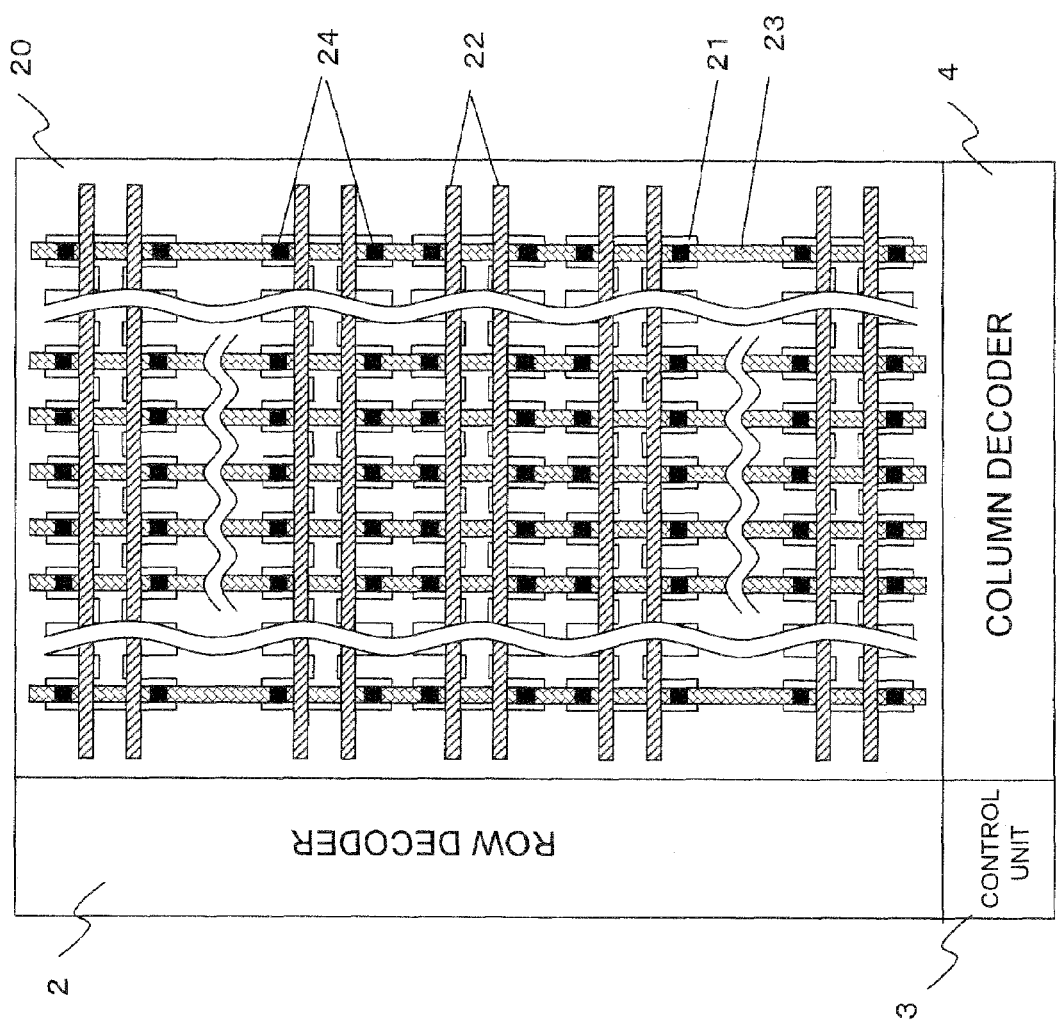
FIG. 7 is a layout drawing showing the structure of a conventional semiconductor memory device.
Figure 8:
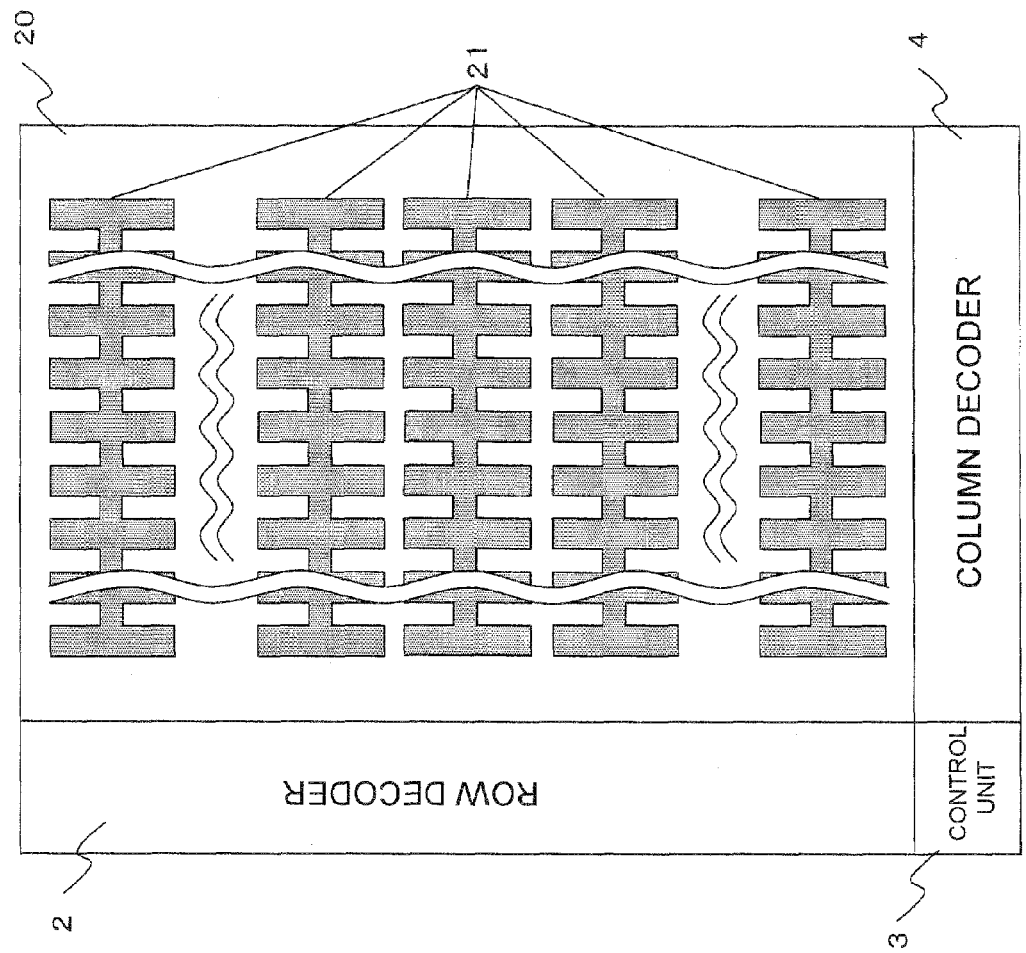
FIG. 8 is a layout drawing showing the shape of the memory cell diffused mask patterns of a memory cell array of FIG. 7.
Figure 9:
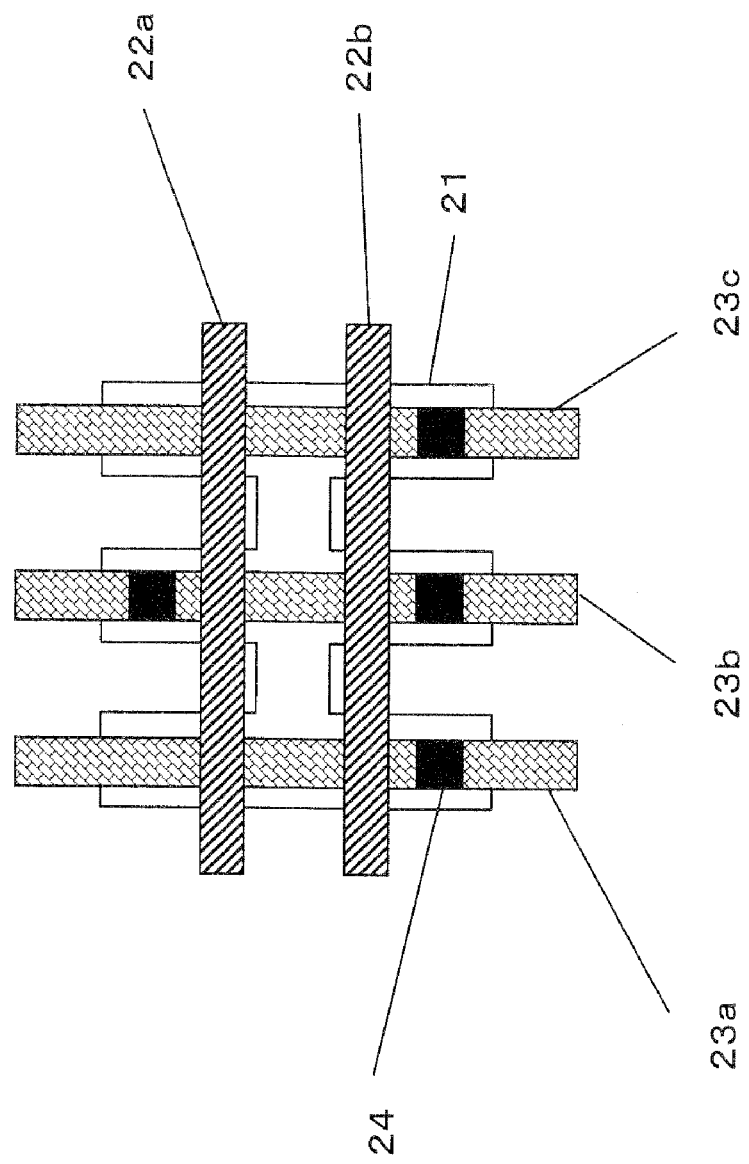
FIG. 9 is a layout drawing of part of the memory cell array of FIG. 7.

For example, in FIG. 6, with regard to the upper memory cell transistor whose gate is connected to the word line (n) 6a of the 2-bit memory cell transistors generated under the bit line (s−1) 7d, data is set at "1" through the absence of the drain node contact 9 and with regard to the lower memory cell transistor whose gate is connected to the word line (n−1) 6b, data is set at "0" through the presence of the drain node contact 9. Likewise, with regard to both the upper and lower 2-bit memory cell transistors generated under the bit line (s)

7e, data is set at "1"; with regard to the upper memory cell transistor whose gate is connected to the word line (n) 6a of the 2-bit memory cell transistors generated under the bit line (s+1) 7f, data is set at "0"; and with regard to the lower memory cell transistor whose gate is connected to the word line (n−1) 6b, data is set at "1".

According to this embodiment, the three sets of adjacent 2-bit memory cell transistors are formed at the three rectangular memory cell diffused mask patterns 5's and, therefore, when the word line (n) 6a has been selected by the row decoder 2 with a row address signal controlled by the control unit 3, the potential of the sources of the two sets of memory cell transistors on the right and left is set at the ground potential by the source line 8 ground at the row decoder and the source node contacts 10's; on the other hand, the source of the middle memory cell transistor is not connected to the source line 8 because such a source node contact 10 is not disposed thereto.

The upper memory cell transistors of the three rectangular memory cell diffused mask patterns 5's are turned on through the selection of the word line (n) 6a. Then the bit line (s+1) 7f, which is connected to the memory cell via the drain node contact 9 disposed in advance, comes to have the ground potential presenting the source potential and in response to the selection of the bit line (s+1) 7f made by the column decoder 4 with a column address signal controlled by the control unit 3, data "0" is read out. On the other hand, the potential of the bit lines (s−1) 7d and (s) 7e for to the memory cells to which such a drain node contact 9 is not disposed in advance remains at the precharge potential because the memory cell transistors are turned on but the source potential is not conveyed to the bit lines (s−1) 7d and (s) 7e due to the nondisposition of the drain node contact 9. Therefore, when the bit lines (s−1) 7d and (s) 7e have been selected by the column decoder 4 with a column address signal controlled by the control unit 3, data "1" is read out.

Likewise, when the word line (n−1) 6b has been selected by the row decoder 2 with a row address signal controlled by the control unit 3, the potential of the sources of the two sets of memory cell transistors on the right and left is set at the ground potential with the source line 8 grounded at the row decoder and the source node contacts 10's; on the other hand, the source of the middle memory cell transistor is not connected to the source line 8 because such a source node contact 10 is not disposed thereto.

The lower memory cell transistors of the three rectangular memory cell diffused mask patterns 5's are turned on through the selection of the word line (n−1) 6b. Then the bit line (s−1) 7d, which is connected to the memory cell via the drain node contact 9 disposed in advance, comes to have the ground potential the source potential and in response to the selection of the bit line (s−1) 7d made by the column decoder 4 with a column address signal controlled by the control unit 3, data "0" is read out. On the other hand, the potential of the bit lines (s) 7e and (s+1) 7f for to the memory cells to which such a drain node contact 9 is not disposed in advance remains at the precharge potential because the memory cell transistors are turned on but the source potential is not conveyed to the bit lines (s) 7e and (s+1) 7f due to the nondisposition of the drain node contact 9. Therefore, when the bit lines (s) 7e and (s+1) 7f have been selected by the column decoder 4 with a column address signal controlled by the control unit 3, data "1" is read out.

As described above, via the bit line (s) 7e connected with both the adjacent 2-bit memory cell transistors in which ROM data is set at "1" as well, it is possible to read the set value therefrom, and therefore, in such a case, there is no need to dispose the source node contact 10, and therefore the number of the source node contacts is reduced. Because of this, it is possible to prevent all the contacts from being disposed densely and to easily form the contact patterns, thereby the effect of improving the yield of the semiconductor memory device can be obtained.

The invention claimed is:

1. A semiconductor memory device comprising:
   plural memory cell transistor pairs;
   plural metal lines supplied with a predetermined power supply potential; and
   plural memory cell read data lines, wherein:
   the memory cell transistor pairs are arranged in a row-column array,
   two memory cell transistors constituting each memory cell transistor pair of the plural memory cell transistor pairs share a common source diffusion region, and the source diffusion region of the two memory cell transistors constituting each memory cell transistor pair of the plural memory cell transistor pairs is separated from another source diffusion region of another two memory cell transistors constituting another memory cell transistor pair of the plural memory cell transistor pairs,
   the source diffusion regions of the memory cell transistor pairs in the same row are connected by one common metal line of the plural metal lines,
   a first metal wiring layer, which is a lowest layer, is used as the plural metal lines supplied with the predetermined power supply potential, and
   the plural memory cell read data lines are provided in such a manner that one of the memory cell read data lines is provided for each column of the array, and a second metal wiring layer or an even upper wiring layer is used as the plural memory cell read data lines.

2. A semiconductor memory device comprising:
   plural memory cell transistor pairs;
   plural metal lines supplied with a predetermined power supply potential; and
   plural memory cell read data lines, wherein:
   the memory cell transistor pairs are arranged in a row-column array,
   two memory cell transistors constituting each memory cell transistor pair of the plural memory cell transistor pairs share a common source diffusion region, and the source diffusion region of the two memory cell transistors constituting each memory cell transistor pair of the plural memory cell transistor pairs is separated from another source diffusion region of another two memory cell transistors constituting another memory cell transistor pair of the plural memory cell transistor pairs,
   the source diffusion regions of the memory cell transistor pairs in the same row are connected by one common metal line of the plural metal lines,
   a first metal wiring layer, which is a lowest layer, is used as the plural metal lines supplied with the predetermined power supply potential,
   the plural memory cell read data lines are provided in such a manner that one of the memory cell read data lines is provided for each column of the array, and a second metal wiring layer or an even upper wiring layer is used as the plural memory cell read data lines, and
   the predetermined power supply potential is a ground potential.

3. A semiconductor memory device comprising:
   plural memory cell transistor pairs;
   plural metal lines supplied with a predetermined power supply potential;

plural memory cell read data lines; and
plural source potential strapping lines, wherein:
the memory cell transistor pairs are arranged in a row-column array,
two memory cell transistors constituting each memory cell transistor pair of the plural memory cell transistor pairs share a common source diffusion region, and the source diffusion region of the two memory cell transistors constituting each memory cell transistor pair of the plural memory cell transistor pairs is separated from another source diffusion region of another two memory cell transistors constituting another memory cell transistor pair of the plural memory cell transistor pairs,
the source diffusion regions of the memory cell transistor pairs in the same row are connected by one common metal line of the plural metal lines,
the plural memory cell read data lines are provided for each column of the array,
the plural source potential strapping lines are provided for each of the plural memory cell read data lines, and
at least one of the plural memory cell transistor pairs is disposed under an area where the plural source potential strapping lines are provided.

4. A semiconductor memory device comprising:
plural memory cell transistor pairs;
plural metal lines supplied with a predetermined power supply potential;
plural memory cell read data lines; and
plural source potential strapping lines, wherein:
the memory cell transistor pairs are arranged in a row-column array,
two memory cell transistors constituting each memory cell transistor pair of the plural memory cell transistor pairs share a common source diffusion region, and the source diffusion region of the two memory cell transistors constituting each memory cell transistor pair of the plural memory cell transistor pairs is separated from another source diffusion region of another two memory cell transistors constituting another memory cell transistor pair of the plural memory cell transistor pairs,
the source diffusion regions of the memory cell transistor pairs in the same row are connected by one common metal line of the plural metal lines,
the plural memory cell read data lines are provided for each column of the array,
the plural source potential strapping lines are provided for each of the plural memory cell read data lines,
at least one of the plural memory cell transistor pairs is disposed under an area where the plural source potential strapping lines are provided, and
sources and drains of the at least one memory cell transistor pair disposed under the area where the plural source potential strapping lines are provided are out of contact with a wiring layer.

\* \* \* \* \*

UNITED STATES PATENT AND TRADEMARK OFFICE
CERTIFICATE OF CORRECTION

PATENT NO. : 7,634,744 B2 Page 1 of 1
APPLICATION NO. : 11/488196
DATED : December 15, 2009
INVENTOR(S) : Sumimoto et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 464 days.

Signed and Sealed this

Twenty-first Day of December, 2010

David J. Kappos
*Director of the United States Patent and Trademark Office*